(12) United States Patent
Kashiwabara (10) Patent No.: US 8,102,036 B2
(45) Date of Patent: Jan. 24, 2012

(54) SEMICONDUCTOR DEVICE IN WHICH A SEMICONDUCTOR CHIP IS SEALED

(75) Inventor: Yasushi Kashiwabara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 12/511,492

(22) Filed: Jul. 29, 2009

(65) Prior Publication Data

US 2010/0109165 A1   May 6, 2010

(30) Foreign Application Priority Data

Nov. 5, 2008   (JP) ................. 2008-284354

(51) Int. Cl.
*H01L 23/58* (2006.01)
(52) U.S. Cl. ........ 257/664; 257/728; 333/238; 333/243; 333/246
(58) Field of Classification Search .................. 257/778, 257/664
See application file for complete search history.

(56) References Cited

U.S. PATENT DOCUMENTS

| | | | |
|---|---|---|---|
| 4,672,151 A | 6/1987 | Yamamura | |
| 4,698,661 A * | 10/1987 | Bessonneau et al. | 257/664 |
| 5,023,993 A | 6/1991 | Fengelly | |
| 6,023,080 A | 2/2000 | Kojima | |
| 6,043,556 A | 3/2000 | Tomie | |
| 6,441,697 B1 * | 8/2002 | Garland et al. | 333/34 |
| 6,639,487 B1 * | 10/2003 | Salmela et al. | 333/34 |
| 7,212,088 B1 | 5/2007 | Norregaard | |
| 2004/0174231 A1 | 9/2004 | Maeda et al. | |
| 2005/0184831 A1 * | 8/2005 | Yasuda et al. | 333/204 |
| 2007/0080763 A1 | 4/2007 | Takagi | |

FOREIGN PATENT DOCUMENTS

| | | | |
|---|---|---|---|
| EP | 1 772 904 A2 | | 4/2007 |
| EP | 1 772 904 A3 | | 4/2007 |
| JP | 2003-115732 | | 4/2003 |
| JP | 2005-123995 | * | 5/2005 |
| JP | 2007-81125 | | 3/2007 |
| WO | WO 99/40627 | | 8/1999 |

\* cited by examiner

*Primary Examiner* — Ajay K Arora
(74) *Attorney, Agent, or Firm* — Oblon, Spivak, McClelland, Maier & Neustadt, L.L.P.

(57) ABSTRACT

A semiconductor device having a GaAsFET and input and output matching circuits connected to the FET is provided. In the semiconductor device, a line, including a wire connection portion connected to the input or output matching circuit and a lead connection portion connected to an input or output lead which is connected to an external circuit, is formed in such a manner that a line width at the wire connection portion is wider than that at the lead connection portion. With the semiconductor device, the number of wires connecting the input or output matching circuits with the wire connection portion can be increased.

12 Claims, 8 Drawing Sheets

SEMICONDUCTOR DEVICE IN WHICH A SEMICONDUCTOR CHIP IS SEALED

CROSS REFERENCE TO RELATED APPLICATIONS

This application is based upon and claims the benefit of priority from the prior Japanese Patent Application No. 2008-284354 filed in Japan on Nov. 5, 2008; the entire contents of which are incorporated herein by reference.

TECHNICAL FIELD

The present invention relates to a semiconductor device with high design flexibility and capable of high power output.

BACKGROUND ART

In a conventional semiconductor device, a semiconductor chip, input and output matching circuits are placed on a base substrate. That is, the semiconductor chip and the input and output matching circuits are placed in a metal frame body formed on the base substrate. In addition, a lid is placed on the frame body to seal the inside of the frame body.

In such a semiconductor device, the semiconductor chip is connected to the input and output matching circuits formed on input and output sides, respectively, through a plurality of wires.

Each of the input and output matching circuits is connected to an input or output line connected with either of an input lead or an output lead through a connection portion composed of a plurality of wires.

Each of the input and output lines connected to the input and output matching circuits, respectively, is formed in a manner that one end thereof connected with the input or output lead has the same width as that of the other end thereof connected with the plurality of wires, as disclosed in Japanese Patent Application Laid-Open Nos. 2003-115732 and 2007-81125.

In the conventional semiconductor device, when a large amount of power is output, the output power may exceed an allowable electric power at the connection portion connecting the input or output line and the input or output matching circuit. In this case, there is posed a problem that wires composing the connection portion may melt.

This melting of wires is resolved by increasing the number of wires composing the connection portion. This is because increasing the number of wires can increase the allowable electric power at the connection portion.

However, in the conventional semiconductor device, the number of wires composing the connection portion is limited by a width of a line. Accordingly, the conventional semiconductor device has various electrical problems.

A first problem is that the electric power which the semiconductor device can output is limited because limitation in the number of wires restricts the maximum allowable electric power at the connection portion.

A second problem is that impedance matching between the connection portion and the input and output matching circuits is difficult because limitation in the number of wires restricts the minimum impedance of the connection portion. Accordingly, the conventional semiconductor device has a problem that flexibility in a circuit design of the input and output matching circuits is limited due to an impedance of the connection portion.

SUMMARY

According to an embodiment of the present invention, there is provided a semiconductor device including: a base substrate; a semiconductor chip mounted on the base substrate; a dielectric substrate mounted on the base substrate; a circuit pattern mounted on the dielectric substrate and connected with the semiconductor chip through a conductor line; a dielectric block mounted on the base substrate; and a waveguide mounted on the dielectric block, the waveguide having a lead connection portion connected with an external device through a lead wire and a wire connection portion connected with the circuit pattern and having a larger width than the lead connection portion.

According to another embodiment of the present invention, there is provided a semiconductor device including: a base substrate; a semiconductor chip mounted on the base substrate; a dielectric substrate mounted on the base substrate; a circuit pattern mounted on the dielectric substrate and connected with the semiconductor chip through a conductor line; a dielectric block mounted on the base substrate; a waveguide mounted on the dielectric block, the waveguide having a lead connection portion connected with an external device through a lead wire and a wire connection portion connected with the circuit pattern and having a larger width than the lead connection portion; a metal plating layer formed on a side face of the dielectric block; and a protection pattern formed from a conductor on the dielectric block in a manner spaced from the waveguide and connected to the metal plating layer and having a larger width than a sticking-out width of the metal plating layer.

DETAILED DESCRIPTION

A semiconductor device according to an embodiment of the present invention will be described in detail with reference to the accompanying drawings.

First Embodiment

Figure 1:
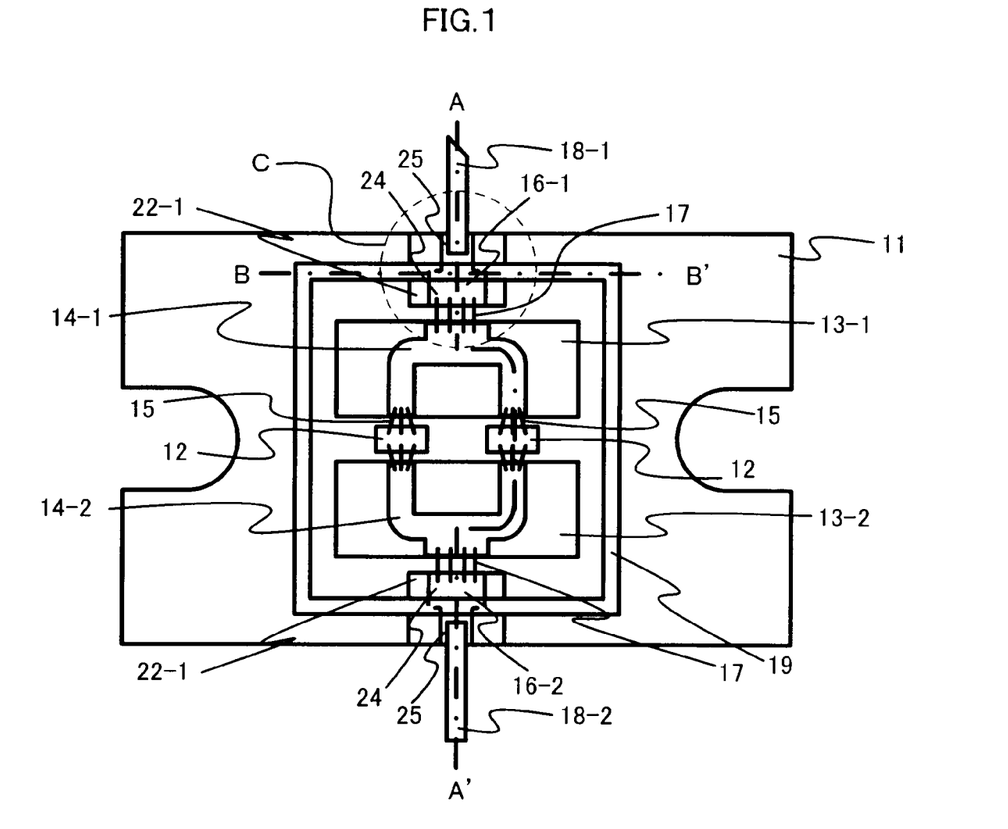
FIG. 1 is a top view illustrating a semiconductor device according to a first embodiment of the present invention.
Figure 2A:
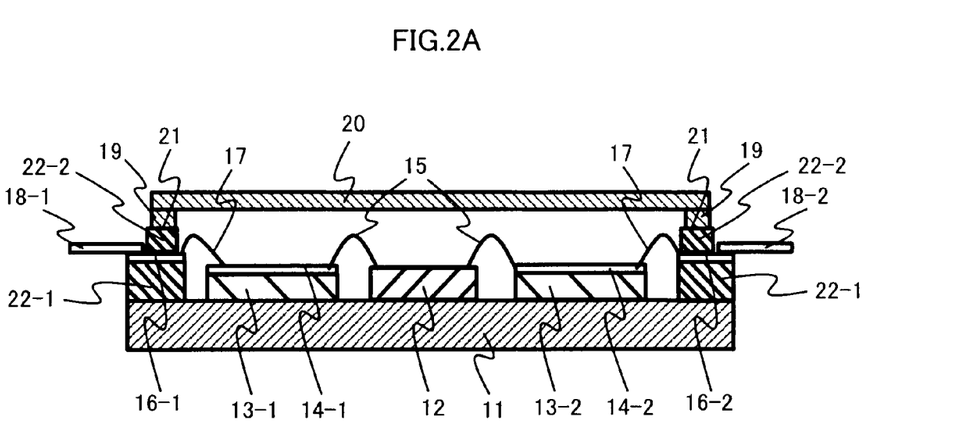
FIG. 2A is a sectional view of the semiconductor device taken along a dotted and dashed line A-A' in FIG. 1.
Figure 2B:
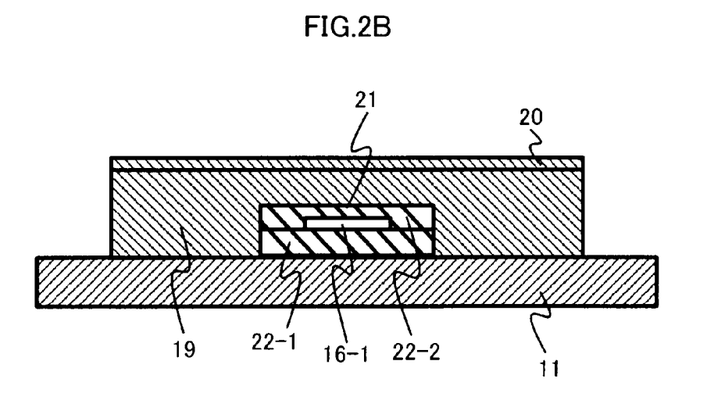
FIG. 2B is a sectional view of the semiconductor device taken along a dotted and dashed line B-B' in FIG. 1.

FIG. 1 is a top view illustrating a semiconductor device according to a first embodiment of the present invention. FIG. 2A is a sectional view taken along a dotted and dashed line A-A' in FIG. 1 and FIG. 2B is a sectional view taken along a dotted and dashed line B-B' in FIG. 1. However, FIG. 1 is a partially omitted illustration of the semiconductor device.

As illustrated in FIG. 1, on a metal base substrate 11, GaAsFET 12, for example, is placed as a semiconductor element used for power amplification or the like. On input and output portions of the GaAsFET 12, there are placed a first dielectric substrate 13-1 and a second dielectric substrate 13-2 formed from, for example, ceramic.

On the first dielectric substrate 13-1, an input matching circuit 14-1 as a first circuit pattern is formed. On the second dielectric substrate 13-2, an output matching circuit 14-2 as a second circuit pattern is formed.

The input matching circuit 14-1 and the GaAsFET 12, and the GaAsFET 12 and an output matching circuit 14-2 are connected through a first connection portion, respectively. The first connection portion is composed of, for example, a plurality of first gold wires 15, each of which is a conductor line.

The input matching circuit 14-1 is connected with a wire connection portion 24 which is one end of an input line 16-1 as a first waveguide through a second connection portion. Similarly, the output matching circuit 14-2 is connected with a wire connection portion 24 which is one end of an output line 16-2 as a second waveguide through a second connection portion. The second connection portions are composed of a plurality of second gold wires 17, respectively.

A lead connection portion 25 which is the other end of the input line 16-1 is connected with an input lead 18-1 connected to an external circuit (not illustrated). A lead connection portion 25 which is the other end of the output line 16-2 is connected with an output lead 18-2 connected to an external circuit (not illustrated).

The input line 16-1 and the output line 16-2 are, for example, strip lines or micro strip lines at least having a surface formed from Au.

On the base substrate 11, there is formed a metal frame body 19 so as to surround the first dielectric substrate 13-1 having the input matching circuit 14-1, the GaAsFET 12 and the second dielectric substrate 13-2 having the output matching circuit 14-2.

As illustrated in FIG. 2A, on the frame body 19, a metal lid 20 is disposed. The inside of the device is sealed by the lid 20 and the frame body 19.

As illustrated in FIG. 2B, the metal frame body 19 has recessed portions 21 at positions of the side portions opposed to each other. In each of the recessed portions 21, a first dielectric block 22-1 formed from, for example, ceramic is formed so as to stick out inwardly and outwardly beyond the frame body 19.

On a surface of the first dielectric block 22-1, the input line 16-1 or the output line 16-2 is formed. The input line 16-1 and the output line 16-2 are formed in a manner that a line width at the wire connection portions 24 is larger than that at the lead connection portions 25 connected to the input and output leads 18-1, 18-2, respectively. The line width at the wire connection portion 24 may be any large width, provided that the input line 16-1 or the output line 16-2 is in no contact with the metal frame body 19.

In a case where a metal plating layer is formed on a side face of the first dielectric block 22-1, the line width of the wire connection portion 24 may be any large width, provided that the input line 16-1 or the output line 16-2 is in no contact with the metal plating layer.

On each of the input and output lines 16-1, 16-2, there is formed a second dielectric block 22-2 made of a dielectric such as ceramic.

As described above, in the semiconductor device according to the present embodiment, the input and output lines 16-1, 16-2 are formed in a manner that a line width at the wire connection portions 24 is larger than that at the lead connection portions 25. Accordingly, the number of the second gold wires 17 composing the second connection portion can be increased.

Since the number of the second gold wires 17 can be increased in this way, it is possible to increase the maximum allowable electric power at the second connection portion. Accordingly, in the semiconductor device according the embodiment of the present invention, high power output can be attained.

Further, since the number of the second gold wires 17 can be increased, it is possible to further reduce a minimum impedance of the second connection portion. In other words, controlling the impedance of the second connection portion can be facilitated.

Particularly in a high-frequency circuit, controlling the impedance of the second connection portion is facilitated, thereby improving design flexibility of the input and output matching circuits 14-1, 14-2 connected with the second connection portions. Accordingly, more efficient input and output matching circuits 14-1, 14-2 can be designed.

Referring next to FIGS. 3A to 3E, modified examples of the input and output lines 16-1, 16-2 will be described below.

Figure 3A:
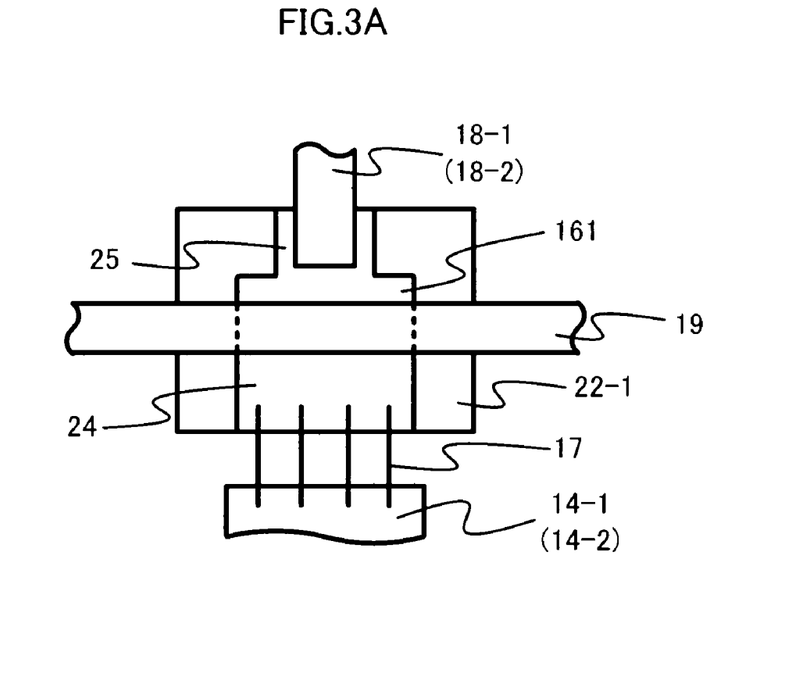
FIG. 3A is an enlarged view illustrating a first modified example of input and output lines formed on the semiconductor device according to the first embodiment.

A first modified example illustrated in FIG. 3A is an example in which a line 161 of a line width equal to a line width at the wire connection portion 24 is formed from the inside to the outside of the frame body 19.

Figure 3B:
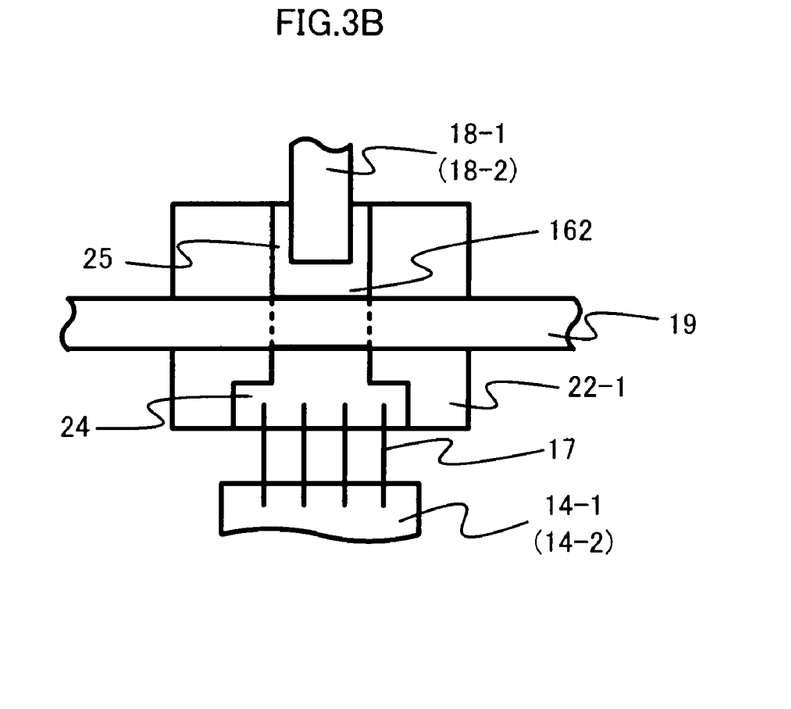
FIG. 3B is an enlarged view illustrating a second modified example of input and output lines formed on the semiconductor device according to the first embodiment.

On the contrary, a second modified example illustrated in FIG. 3B is an example in which a line 162 of a line width at the lead connection portion 25 is formed from the outside to the inside of the frame body 19.

Figure 3C:
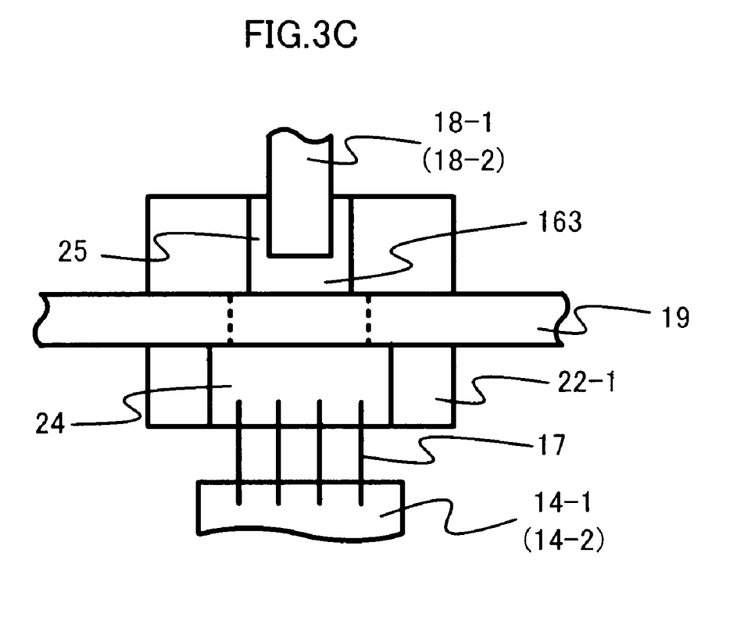
FIG. 3C is an enlarged view illustrating a third modified example of input and output lines formed on the semiconductor device according to the first embodiment.

A third modified example illustrated in FIG. 3C is an example in which a line 163 is formed so that a line width becomes wider like a staircase pattern from the lead connection portion 25 toward the wire connection portion 24.

Figure 3D:
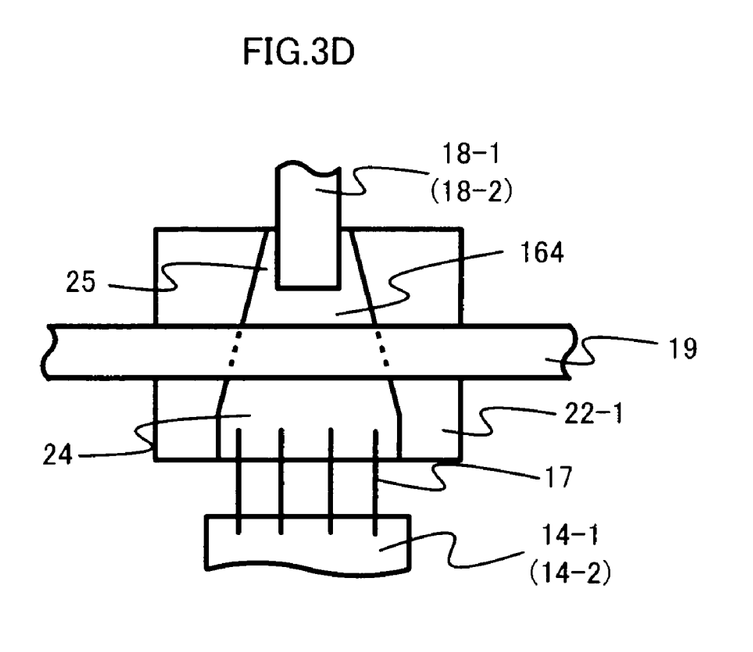
FIG. 3D is an enlarged view illustrating a fourth modified example of input and output lines formed on the semiconductor device according to the first embodiment.

A fourth modified example illustrated in FIG. 3D is an example in which a line 164 is formed so that a line width becomes wider in a tapered pattern from the lead connection portion 25 toward the wire connection portion 24.

Figure 3E:
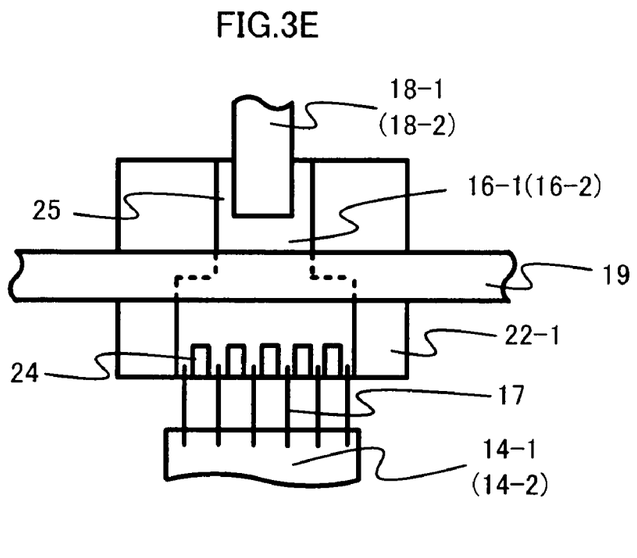
FIG. 3E is an enlarged view illustrating a fifth modified example of input and output lines formed on the semiconductor device according to the first embodiment.

Further, a fifth modified example illustrated in FIG. 3E is an example in which the wire connection portion 24 is formed in a comb-like pattern. The fifth modified example may be applied not only to the input and output lines 16-1, 16-2 illustrated in FIG. 1 but also to the input and output lines 16-1, 16-2 illustrated in FIGS. 3A to 3D.

As illustrated in FIGS. 3A to 3E, in the input and output lines 16-1, 16-2, it is sufficient that at least the line width at the wire connection portion 24 is larger than that at the lead connection portion 25.

Even in the semiconductor device having the input and output lines 16-1, 16-2 of the respective geometries described above, the number of the second gold wires 17 composing the second connection portion can be increased. Therefore, it is possible to increase the maximum allowable electric power at the second connection portion. In addition, the minimum impedance of the second connection portion can be further reduced, thereby allowing more efficient input and output matching circuits 14-1, 14-2 to be designed.

Second Embodiment

Next, a semiconductor device according to a second embodiment of the present invention will be described below. The following description will be made only on a difference from the semiconductor device according to the first embodiment.

Figure 4A:
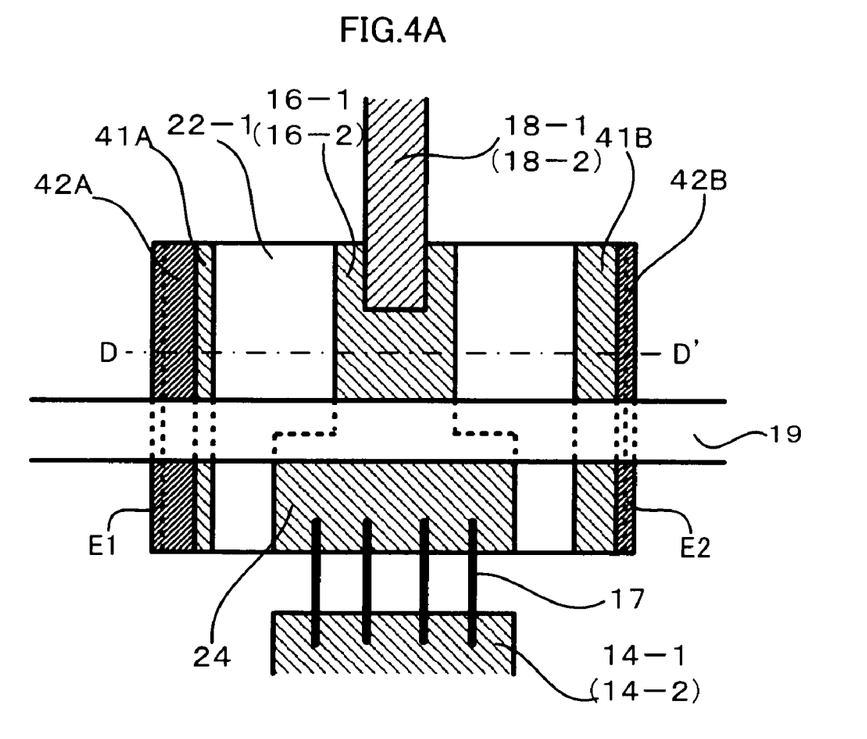
FIG. 4A is a top view illustrating a semiconductor device according to a second embodiment of the present invention and is an enlarged view of an area C in FIG. 1.
Figure 4B:
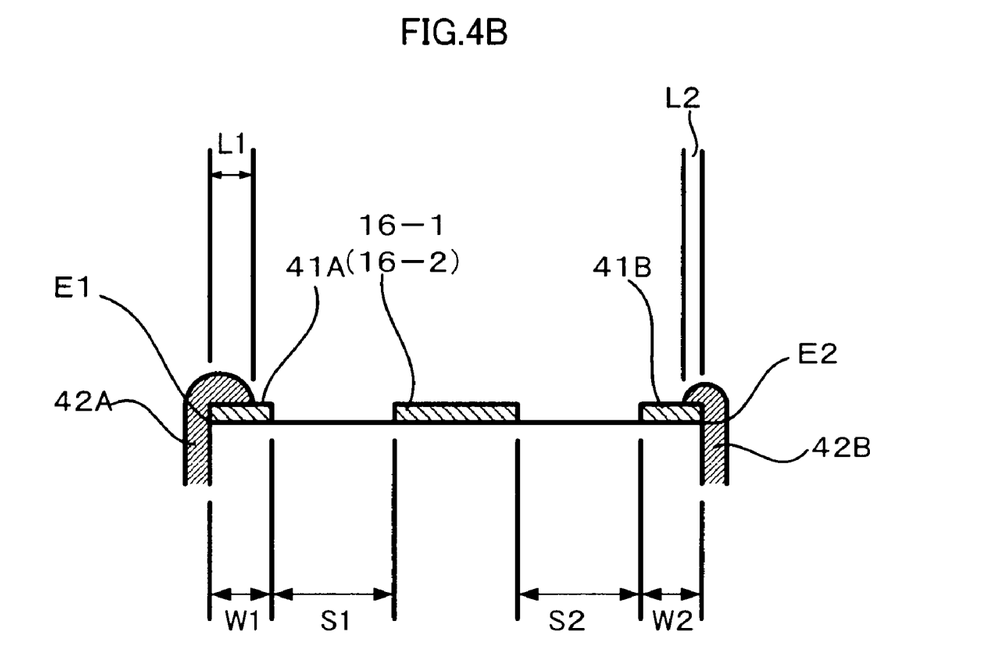
FIG. 4B is a sectional view of the semiconductor device taken along a dotted and dashed line D-D' in FIG. 4A.

FIG. 4A is a top view illustrating the semiconductor device according to the second embodiment and is an enlarged view of an area C in FIG. 1. FIG. 4B is a sectional view taken along a dotted and dashed line D-D' in FIG. 4A.

As illustrated in FIG. 4B, in the semiconductor device according to the present embodiment, metal plating layers 42A, 42B composed of, for example, gold are formed on both side faces of the first dielectric block 22-1.

As illustrated in FIG. 4A, on the first dielectric block 22-1, there are formed protection patterns 41A, 41B composed of conductor such as the same material as the input and output lines 16-1, 16-2. The protection patterns 41A, 41B are provided for the following reason:

In forming the metal plating layers 42A, 42B on the both side faces of the first dielectric block 22-1, metal plating composed of, for example, Au is formed on a surface of the first dielectric block 22-1 to stick out therebeyond. The amount of sticking-out metal is difficult to control in plating, which makes a sticking-out width vary among different positions. When a sticking-out width of metal plating varies in this way, a distance between a sticking-out portion and the input and output lines 16-1, 16-2 becomes smaller and therefore the impedance of the input and output lines 16-1, 16-2 substantially changes with the sticking-out amount of metal plating. Accordingly, there has been a problem that the impedance of the input matching circuit 14-1 connected through the second connection portion does not sufficiently match with the impedance of the input line 16-1. This is the same for impedance matching of the output matching circuit 14-2 with the output line 16-2.

In view of the above, the semiconductor device according to the second embodiment of the present invention has protection patterns 41A, 41B on the first dielectric block 22-1 to prevent impedances of the input and output lines 16-1, 16-2 from being substantially changed due to a difference in the sticking-out width of metal plating.

The protection patterns 41A and 41B provided in this way are provided so as to be in no contact with the input line 16-1 or the output line 16-2. In other words, the line width at the wire connection portion 24 may be any large width, provided that the input line 16-1 or the output line 16-2 is in no contact with the protection patterns 41A, 41B.

Concretely, the protection patterns 41A, 41B are provided separately from the input and output lines 16-1, 16-2 along sides E1, E2 in no contact with the input line 16-1 nor the output line 16-2 of the first dielectric block 22-1. In other words, the protection patterns 41A, 41B are provided so as to be spaced from the input and output lines 16-1, 16-2 along the input and output lines 16-1, 16-2.

In this case, the protection patterns 41A, 41B are provided so as to be spaced from the input and output lines 16-1, 16-2, at least, to such a degree as to be connected with metal plating layers 42A, 42B. This is because, in the case of no connection with the metal plating layers 42A, 42B, a signal running through the input line 16-1 or the output line 16-2 oscillates between the input line 16-1 or the output line 16-2 and the protection patterns 41A, 41B.

Further, the protection patterns 41A and 41B are provided such that lengths thereof are equal to those of the sides E1 and E2.

The sides E1, E2 are the ones formed by a face having the metal plating layers 42A, 42B thereon, of side faces of the first dielectric block 22-1 and a top face of the first dielectric block 22-1.

As illustrated in FIG. 4B, a pattern width W1 of the protection pattern 41A and a pattern width W2 of the protection pattern 41B are larger than a sticking-out width L1 of the metal plating layer 42A and a sticking-out width L2 of the metal plating layer 42B on the side faces of the first dielectric block 22-1. However, the pattern width W1 of the protection pattern 41A and the pattern width W2 of the protection pattern 41B are formed to be equal to each other.

As illustrated in FIG. 4B, the sticking-out width L1 of the metal plating layer 42A and the sticking-out width L2 of the metal plating layer 42B on the side faces of the first dielectric block 22-1 are not always equal to each other.

A width S1 between the protection pattern 41A and the input line 16-1 (or a width S1 between the protection pattern 41A and the output line 16-2) and a width S2 between the protection pattern 41B and the input line 16-1 (or a width S2 between the protection pattern 41B and the output line 16-2) are equal to each other.

According to the semiconductor device of the second embodiment described above, the number of the second gold wires 17 connected with the input and output lines 16-1, 16-2 can be increased. Further, since the distance between the input line 16-1 and the protection patterns 41A, 41B and the distance between the output line 16-2 and the protection patterns 41A, 41B can be kept constant, the impedances of the input and output lines 16-1, 16-2 can be easily controlled to be constant. Hence, the impedances of the input and output matching circuits 14-1, 14-2 and the impedances of the input and output lines 16-1, 16-2 can be sufficiently matched, respectively.

Unlike the protection patterns 41A, 41B illustrated in FIG. 4B, the pattern width W1 of the protection pattern 41A and the pattern width W2 of the protection pattern 41B are not necessarily equal to each other.

The width S1 between the protection pattern 41A and the input line 16-1 (or the width S1 between the protection pattern 41A and the output line 16-2) and the width S2 between the protection pattern 41B and the input line 16-1 (the width S2 between the protection pattern 41B and the output line 16-2) are not necessarily equal to each other.

When the input line 16-1 or the output line 16-2 is not in the center of the first dielectric block 22-1, the width S1 between the protection patterns 41A and the input line 16-1 or the output line 16-2 may be made equal to the width S2 between the protection pattern 41B and the input line 16-1 or the output line 16-2 by changing the pattern width W1 of the protection pattern 41A and the pattern width W2 of the protection pattern 41B.

In the above embodiment, the protection patterns 41A, 41B are provided to have an equal length along the sides E1, E2. However, the protection patterns 41A, 41B are not limited to the above-described embodiment. For example, the protection patterns 41A, 41B may be formed as modified examples illustrated in FIGS. 5A to 5C.

Figure 5A:
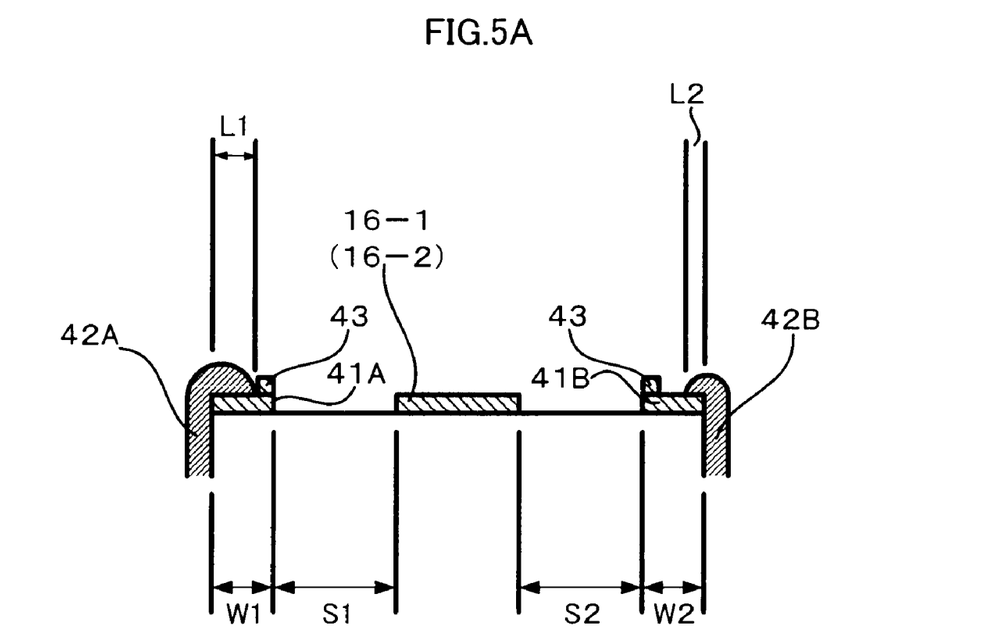
FIG. 5A is a sectional view illustrating a first modified example of protection patterns formed on the semiconductor device according to the second embodiment of the present invention.

A first modified example illustrated in FIG. 5A is an example where protection walls 43 are provided on surfaces of the protection patterns 41A and 41B. Preferably, the protection walls 43 are formed on the sides of the input and output lines 16-1, 16-2 on the protection patterns 41A, 41B. In addition, preferably, the protection walls 43 are formed to the protection patterns 41A, 41B with the same length as the protection patterns 41A, 41B on the protection patterns 41A, 41B in parallel.

The width of the protection wall 43 is not limited. The height is not limited, either, provided that the height is large enough to block sticking-out of the metal plating layer.

A material of the protection wall 43 may be a conductor or a dielectric.

As described above, by forming the protection walls 43 on the protection patterns 41A, 41B, sticking out of the metal plating layers 42A, 42B beyond the protection patterns 41A, 41B is restrained more effectively.

Figure 5B:
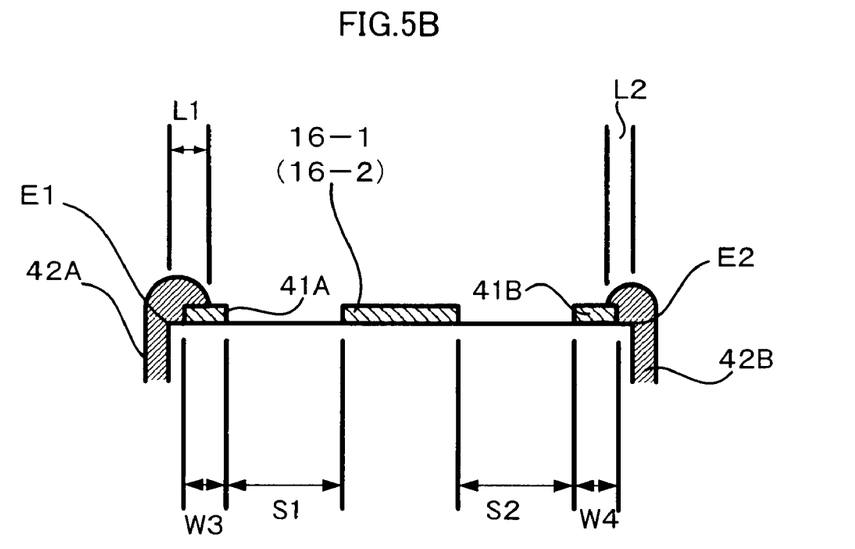
FIG. 5B is a sectional view illustrating a second modified example of protection patterns formed on the semiconductor device according to the second embodiment of the present invention.

A second modified example illustrated in FIG. 5B is an example where the protection patterns 41A, 41B are provided to be spaced from the sides E1, E2. The spacing width is not limited, provided that sticking-out of the metal plating layers 42A, 42B connects the metal plating layers 42A, 42B and the protection patterns 41A, 41B, respectively.

Figure 5C:
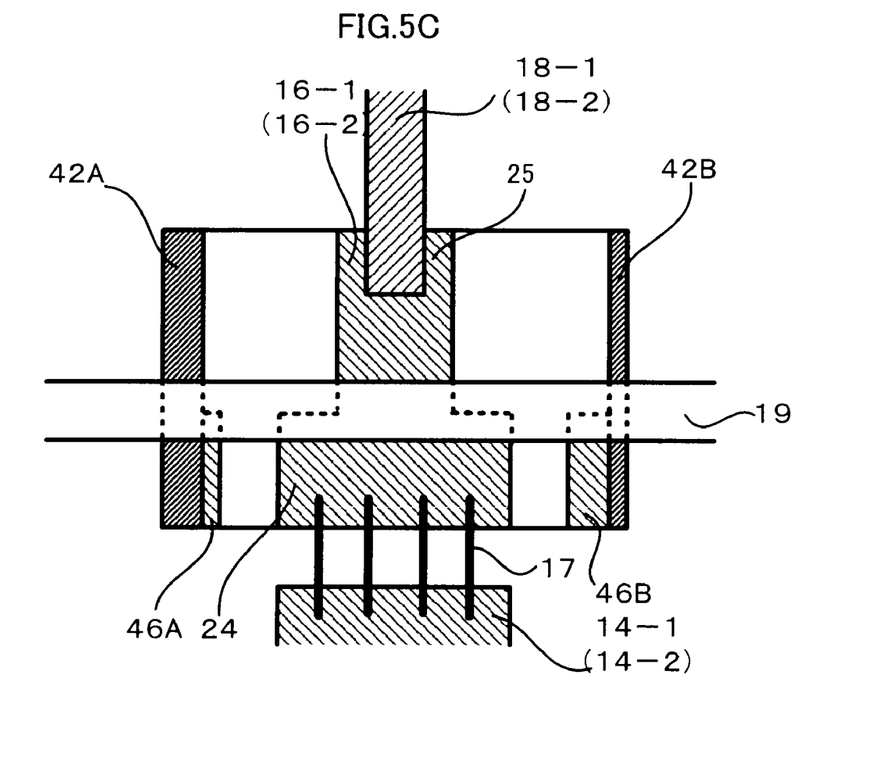
FIG. 5C is an enlarged view illustrating a third modified example of protection patterns formed on the semiconductor device according to the second embodiment of the present invention.

A third modified example illustrated in FIG. 5C is an example where protection patterns 46A, 46B are provided only along the wire connection portion 24. In this case, the impedance of only the wire connection portion 24 can be controlled. This is effective when a distance between the lead connection portion 25 and the sticking-out portions of the metal plating layers 42A, 42B is large enough for the impedances of the input and output lines 16-1, 16-2 to make no substantial changes.

As described above, provision of the protection patterns 41A, 41B, 46A, 46B allows distances between the protection patterns 41A, 41B, 46A, 46B and the input line 16-1 or the output line 16-2 to be equal to each other, respectively. Thereby it is possible to control easily so that the impedances of the input and output lines 16-1, 16-2 may steady.

Even when a geometry of the input line 16-1 or the output line 16-2 is as illustrated in any of FIGS. 3A to 3E, the impedance of the input line 16-1 or the output line 16-2 can be controlled by suitably forming the protection patterns 41A, 41B, 46A, 46B described above in accordance with these geometries.

Figure 6:
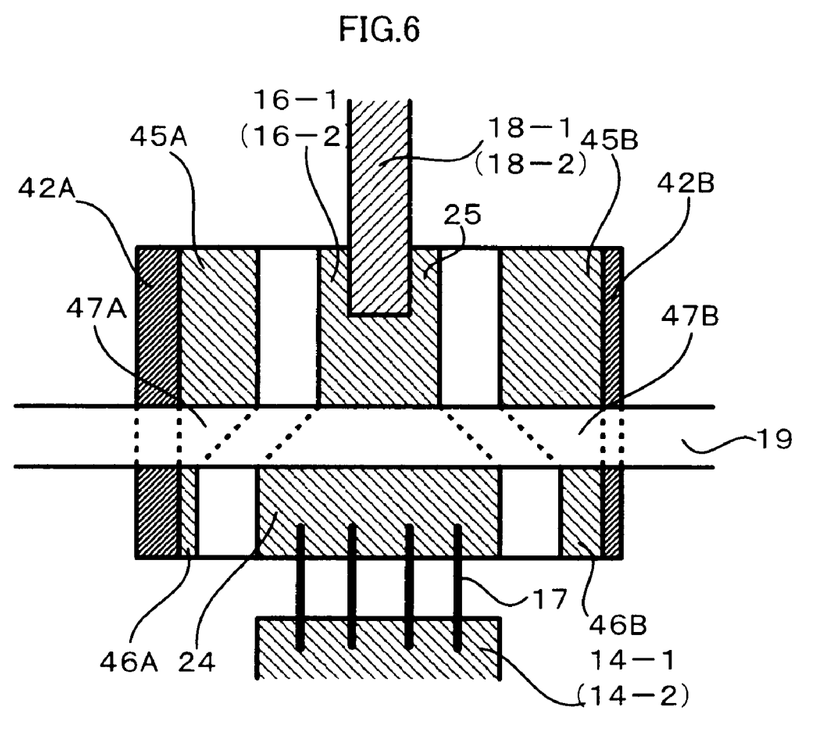
FIG. 6 is an enlarged view illustrating an applied example of protection patterns formed on the semiconductor device according to the second embodiment of the present invention.

For example, as illustrated in FIG. 6, when the input line 16-1 or the output line 16-2 is formed to become wider in a tapered manner from the lead connection portion 25 having a fixed width toward the wire connection portion 24 having a fixed width, the protection pattern may be provided along the geometry of the input line 16-1 or the output line 16-2.

Concretely, at portions along the wire connection portion 24, the protection patterns 46A, 46B, each having a fixed small width, are provided. At portions along the lead connection portion 25, protection patterns 45A, 45B, each having a larger width than those of the protection patterns 46A, 46B, are provided. In addition, at portions along the part where the input line 16-1 or the output line 16-2 widens in a tapered manner, the protection patterns 47A, 47B, each having a width changing according to the tapered part, are provided.

As described above, even when the protection patterns 45A, 46A, 47A, 45B, 46B, 47B are provided along a geometry of the input line 16-2 or the output line 16-2, sticking-out of the metal plating layers 42A, 42B beyond the protection patterns 45A, 46A, 47A, 45B, 46B, 47B can be restrained.

The semiconductor device according to embodiments of the present invention has been described above. However, the semiconductor device according to embodiments of the present invention is not limited to the respective embodiments described above.

Figure 7:
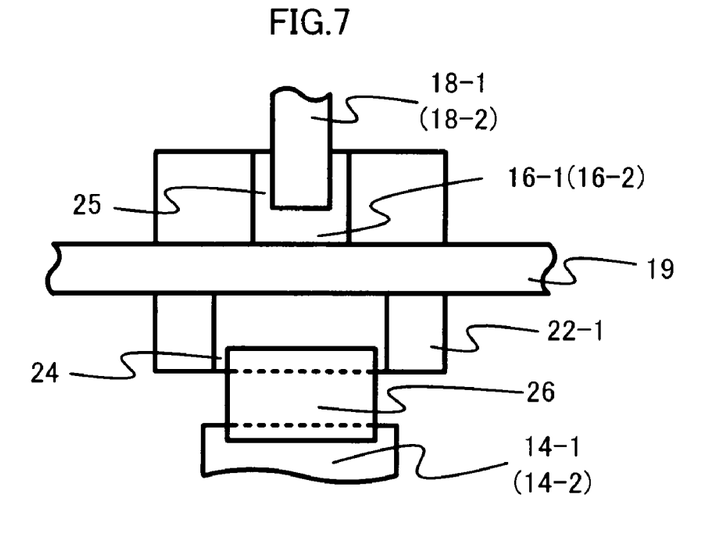
FIG. 7 is an enlarged view illustrating another embodiment of a connection portion of the input and output lines with the input and output matching circuits of the semiconductor device according to the first and second embodiments of the present invention.

For example, as illustrated in FIG. 7, the connection between the input line 16-1 and the input matching circuit 14-1 or between the output matching circuit 14-2 and the output line 16-2 is not limited to the plurality of second wires 17, and may also be made through foil metal composed of gold foil 26, for example. Metal used for the first wire 15, the second wire 17 and the foil may be aluminum.

A semiconductor element included in the semiconductor device according to embodiments of the present invention is not limited to GaAsFET 12, and may be GaNFET or any other semiconductor element. Further, the number of semiconductor elements is not limited to the number in the semiconductor device according to embodiments of the present invention described above.

In addition, the first and second dielectric substrates 13-1, 13-2 and the first and second dielectric blocks 22-1, 22-2 are not limited to ceramic. Further, circuit patterns on the first dielectric substrate 13-1 and the second dielectric substrate 13-2 are not limited to the input and output matching circuits 14-1, 14-2.

What is claimed is:

1. A semiconductor device comprising:
   a base substrate;
   a semiconductor chip mounted on the base substrate;
   a dielectric substrate mounted on the base substrate;
   a circuit pattern mounted on the dielectric substrate and connected with the semiconductor chip through a conductor line;
   a dielectric block mounted on the base substrate;
   a waveguide mounted on the dielectric block, the waveguide having a lead connection portion connected with a lead wire and a wire connection portion connected with the circuit pattern;
   a protection pattern made of a conductor and having a first surface formed on the dielectric block at a position spaced from the waveguide;
   a metal plating layer formed on a side face of the dielectric block and formed on the protection pattern to extend over at least a portion of a second surface of the protection pattern opposite to the first surface formed on the dielectric block; and
   a length of the wire connection portion in a direction that is perpendicular to a direction in which a signal propagates in the waveguide is longer than that of the lead connection portion.

2. The semiconductor device according to claim 1, wherein the protection pattern has a protection wall on a surface of the protection pattern.

3. The semiconductor device according to claim 1, wherein the protection pattern is provided at an interval relative to a side formed by a surface of the dielectric block and a surface on which a metal plating layer is provided.

4. The semiconductor device according to claim 1, wherein the protection pattern is provided at a fixed interval relative to the waveguide.

5. The semiconductor device according to claim 1, wherein the wire connection portion is formed like a comb-like pattern.

6. The semiconductor device according to claim 1, wherein the waveguide becomes wider in a tapered manner from the lead connection portion toward the wire connection portion.

7. The semiconductor device according to claim 1, wherein the waveguide becomes wider in a staircase pattern from the lead connection portion toward the wire connection portion.

8. The semiconductor device according to claim 1, wherein the wire connection portion is connected with the circuit pattern through wires.

9. The semiconductor device according to claim 8, wherein wires are formed from gold, respectively.

10. The semiconductor device according to claim 1, wherein the circuit pattern is connected with the wire connection portion through a metal foil.

11. The semiconductor device according to claim 10, wherein the metal foil is formed from gold.

12. The semiconductor device according to claim 1, wherein the circuit pattern is a matching circuit.

\* \* \* \* \*